United States Patent [19]

Nishizawa et al.

[11] Patent Number: 4,811,064

[45] Date of Patent: * Mar. 7, 1989

[54] STATIC INDUCTION TRANSISTOR AND INTEGRATED CIRCUIT DEVICE USING SAME

[75] Inventors: Jun-Ichi Nishizawa, Sendai, Japan; Bogdan M. Wilamowski, Gdansk, Poland

[73] Assignee: Zaidan Hojin Handotai Kenkyu Shinkokai, Sendai, Japan

[*] Notice: The portion of the term of this patent subsequent to Mar. 31, 1998 has been disclaimed.

[21] Appl. No.: 9,017

[22] Filed: Jan. 28, 1987

Related U.S. Application Data

[63] Continuation of Ser. No. 327,493, Dec. 4, 1981, abandoned, which is a continuation of Ser. No. 063,571, Aug. 3, 1979, abandoned, which is a continuation of Ser. No. 819,343, Jul. 27, 1977, abandoned.

[30] Foreign Application Priority Data

Aug. 3, 1976 [JP] Japan ................................. 51-92467

[51] Int. Cl.[4] .................... H01L 27/04; H01L 29/80; H03K 19/091
[52] U.S. Cl. ...................................... 357/22; 357/41; 357/43; 357/46; 357/92
[58] Field of Search .................... 357/44, 46, 92, 22, 357/41

[56] References Cited

U.S. PATENT DOCUMENTS 4,259,681  3/1981  Nishizawa ............................ 357/41

OTHER PUBLICATIONS

Nishizawa et al, "Bipolar Mode Static Induction Transistors", Proc. 11th Conf. (1979) on Solid State Devices (Tokyo), Japan J. Applied Physics, vol. 19 (1980), Suppl. 19-1, pp. 289-293.

Primary Examiner—William D. Larkins
Attorney, Agent, or Firm—Cushman, Darby & Cushman

[57] ABSTRACT

A static induction transistor (SIT) which is made to operate with a forward gate bias by maintaining the width of the channel region at an appropriate value. Such an improved SIT is used as the inverter transistor in a merged transistor logic (MTL) semiconductor IC (integrated circuit) to reduce the time delay-power product by an order or more. The collector region of a bipolar load transistor is continuous to or also serves as the gate region of the inverter SIT. A plurality of channel regions are formed penetrating through this collection/gate region. This SIT is simple in structure, which enables a marked increase in the integration density.

6 Claims, 4 Drawing Sheets

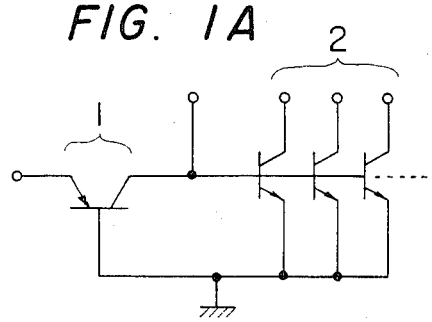
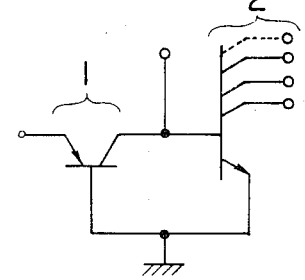
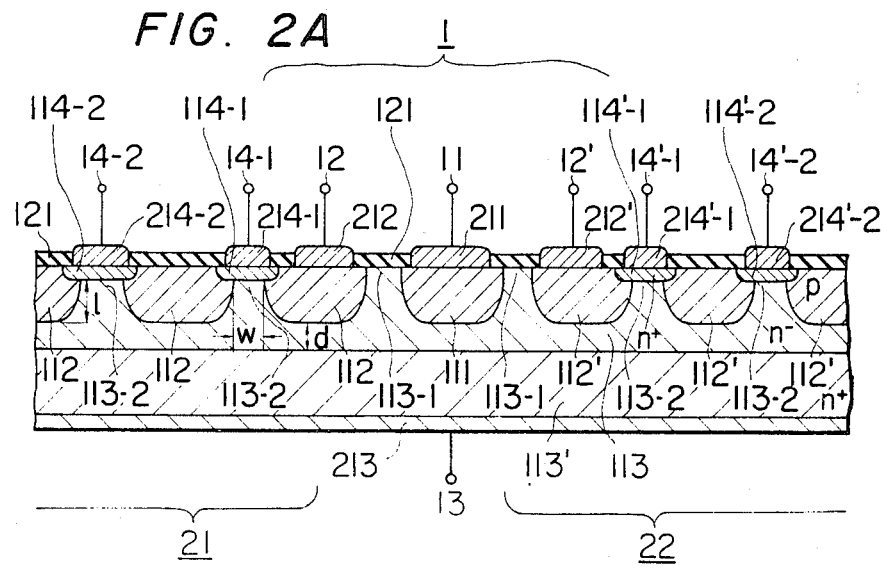
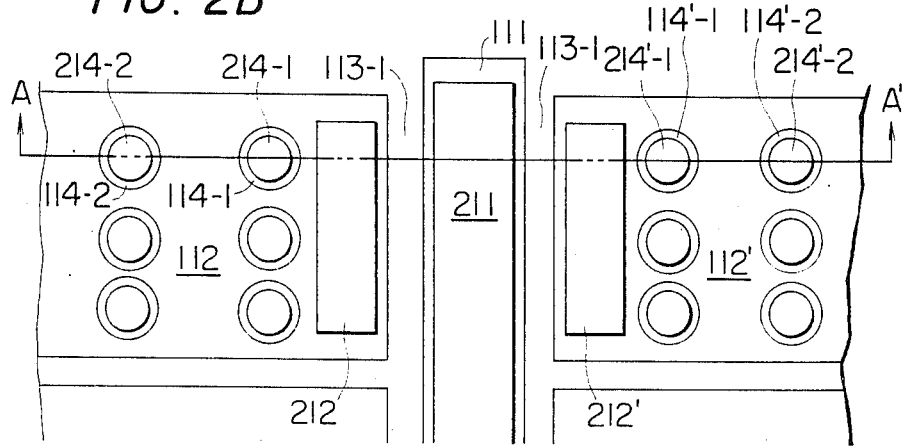

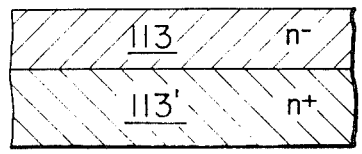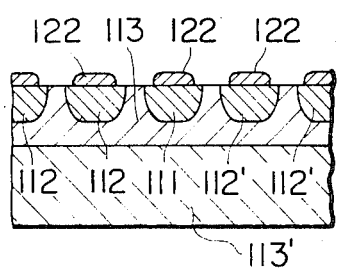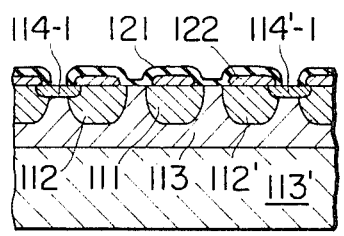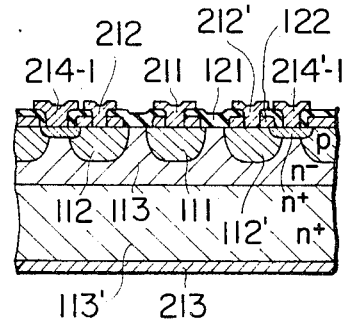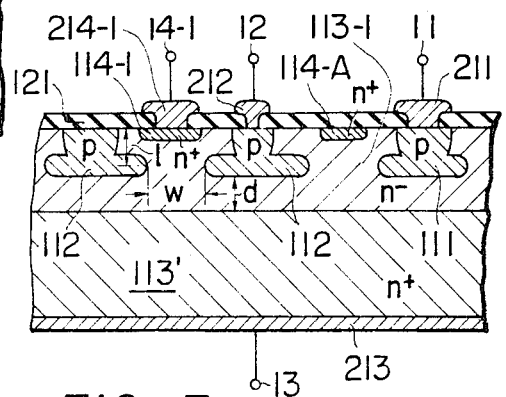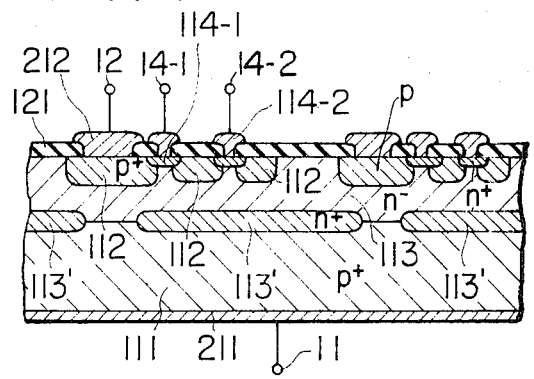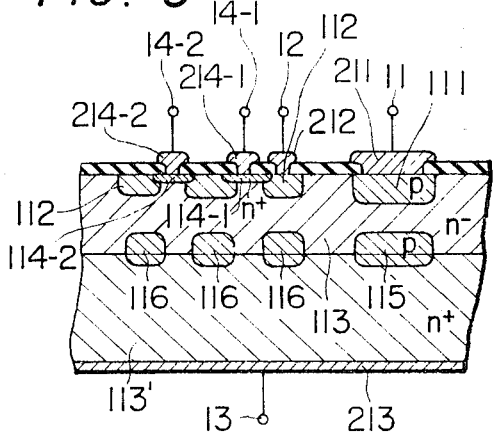

STATIC INDUCTION TRANSISTOR AND INTEGRATED CIRCUIT DEVICE USING SAME

This is a continuation of application Ser. No. 327,493, filed Dec. 4, 1981, which was abandoned upon the filing hereof, and which was a continuation of Ser. No. 063,571, filed Aug. 3, 1979, which was a continuation of Ser. No. 819,343, filed July 27, 1977, both now abandoned.

BACKGROUND OF THE INVENTION (a) Field of the Invention

The present invention relates to a semiconductor device, and more particularly it pertains to a static induction transistor (SIT) adapted for enhancement mode operation and a semiconductor integrated logic circuit utilizing the static induction transistors, which circuit being suitable for high speed and low power consumption use and high density integration.

(b) Description of the Prior Art

Recently, demands for reduction in size and increase in capacity as well as operation speed in semiconductor logic circuits have been becoming greater, in, for example, the field of electronic computers. Complementary MOS (C-MOS) integrated circuits and merged transistor logic (MTL) circuits have attracted the attention of the industrial circles because these circuits have been considered to satisfy the demands.

In particular, the development of MTL circuits has attracted the attention of the industrial circles widely, because they eliminate at least partially the requirement for the provision of isolating layers for the respective constituent elements, which have been necessary in the conventional logic integrated circuits utilizing combinations of bipolar transistors and which have prevented the realization of a high density integration of circuits; and because the development of MTL circuits has made it possible to realize a high density integration and a relatively low power consumption without sacrificing rapid operation of the bipolar transistor; and also because MTL circuits can be manufactured by relying on the conventional techniques.

Further description of the MTL circuit will be made by referring to the accompanying drawings. FIGS. 1A and 1B show the basic structure of an MTL circuit. FIGS. 1A and 1B differ only in the manner of representing a multi-collector transistor, and these two figures point to substantially the same structure of an MTL circuit. The illustrated MTL structure comprises load transistor 1 having its base electrode grounded and assigned for injecting carriers and an inverter transistor 2 of multi-collectors which is connected to the load transistor 1 so that the control electrode of the output transistor 2 receives the injected carriers. In the conventional MTL structure, both the load transistor and the inverter transistor are formed of bipolar transistors. Furthermore, for the purpose of obtaining a large fan-out (the number of outputs which is greater than one), the inverter transistor is usually formed with a multi-collector transistor. The multi-collector transistor is represented in a manner different from each other in FIGS. 1A and 1B. However, since the switching speed of an MTL is determined by the frequency characteristic of the multi-collector inverter bipolar transistor, a remarkable improvement (e.g. increase in the orders) of the switching speed of MTL cannot be expected. More specifically, the product of time delay $\tau$ and power dissipation P, $\tau \times P$, is used generally as a parameter for the evaluation of the performance of a logic integrated circuit (IC). In the case of a conventional MTL circuit, its $\tau \times P$ has a value which is of the order of 0.1 to 1 picojoule (pJ) per gate at most. Assuming here that the power disspiation P is 10 $\mu$W/gate, the time delay (i.e. the switching speed) will be of the order of 10 to 100 nanoseconds at most. Usually, the time constant $\tau$ is represented by the product of the resistance and the capacitance, RC. Denoting that supply voltage as V (which is approximately equal to the logic amplitude) and the effective capacitance per gate as C, the delay-power product may be represented as $\tau \times P \approx RC \times VI = V \cdot (RI) \cdot C \approx V^2 C$. If the effective capacitance C is large as in the case of a bipolar transistor, the delay-power product cannot be reduced markedly. In the usual bipolar transistor, the collector is designed to have a large area than that of the emitter. This is because the carriers injected from the emitter diverge in their transfer. In contrast thereto, in a multi-collector transistor, the area of each collector region is exposed on the surface and is samll. Thus, the current amplification factor $\beta$ becomes small, the fan-out (the number of the outputs of a multi-collector transistor which is controlled of its operation by one input) is 2 to 3 at most. Therefore, noises cannot be suppressed to become extremely small. Furthermore, since the MTL requires the provision of separation layers, of n type in the case of FIGS. 1 and 2, ordinarily for the isolation of the respective gates, these separation layers also hamper the improvement of the integration density. As has been stated above, the currently available integration density of conventional MTL using bipolar transistors is 300 gates/mm$^2$ at most and the currently available integration density of conventional MTL using MOS transistor is of the order of 100 gates/mm$^2$.

The static induction transistor (SIT) has been proposed by one of the present inventors, Jun-Ichi Nishizawa, and he has realized a non-saturation type current/voltage characteristic in this SIT. The Nishizawa SIT has proved superior with respect to, for example, high frequency use, current amplification factor, and low noise as compared to bipolar transistors.

SUMMARY OF THE INVENTION

An object of the present invention is to provide a static induction transistor having an improved structure and which ensures stable operation.

Another object of the present invention is to provide a semiconductor integrated logic circuit utilizing the abovementioned static induction transistor, whereby the logic circuit can exhibit superior high speed operation and low power consumption with a simple structure.

According to an embodiment of the present invention, the delay-power product of a logic IC which employs SIT's is reduced to about 1/10-1/100 of that of the MTL which uses bipolar transistors, so that its high speed operation and low power dissipation of the circuit are improved to a degree incomparable by any other circuit. The integration density can also be raised above one thousand gates per square millimeter.

The static induction transistor logic (SITL) fully utilizes the advantageous properties of the static induction transistor, which are represented by: (1) very small gate-source and gate-drain capacitances, (2) very small resistance in the gate region unlike the base region of a bipolar transistor, and (3) lack of divergence of charge carriers being transferred to the carrier extracting region but rather a convergence of charge carriers. Furthermore, the SIT has the property that, when a reverse bias voltage is applied across the gate and the source, the resistance between the source and the drain becomes high and that, when a forward bias voltage is applied across the gate and the source, the resistance between the source and the drain becomes low with a low threshold voltage. It should be noted that, when the gate is left open, the characteristic of such SIT is determined by the parameters of designing. Due to a low input capacitance and a low noise figure, the power dissipation by the SIT naturally is very small, and therefore the power efficiency is much better than in the instance wherein ordinary resistors are used. Still further, owing to the inherent properties of the SIT that the noise figure is very small and that the current amplification factor is large, there is the further advantage that a large fan-out number can be taken, accruing from these properties. Yet further, a plurality of channels in a multi-drain SIT can be used as the respective outputs, and this leads to a strong-point of the SIT that a very high integration is feasible.

The above and other objects, features and advantages of the present invention will become apparent from the following detailed description of the preferred embodiments of the present invention when taken in conjunction with the accompanying drawings.

BRIEF DESCRIPTION OF THE DRAWINGS

FIGS. 1A and 1B are equivalent circuit diagrams of a conventional MTL circuit.

FIGS. 2A to 2C are a cross section, a plan view and an equivalent circuit diagram, respectively, of a logic IC according to an embodiment of the present invention, in which FIG. 2A is a cross section taken along the line A-A' in FIG. 2B.

FIGS. 5A to 5D are partial cross-sectional views of a semiconductor wafer showing how the logic IC of FIG. 2 is manufactured.

FIGS. 6 to 8 are cross-sectional views of logic IC's according to further embodiments of the present invention.

DETAILED DESCRIPTION OF THE PREFERRED EMBODIMENTS

Figure 2C:
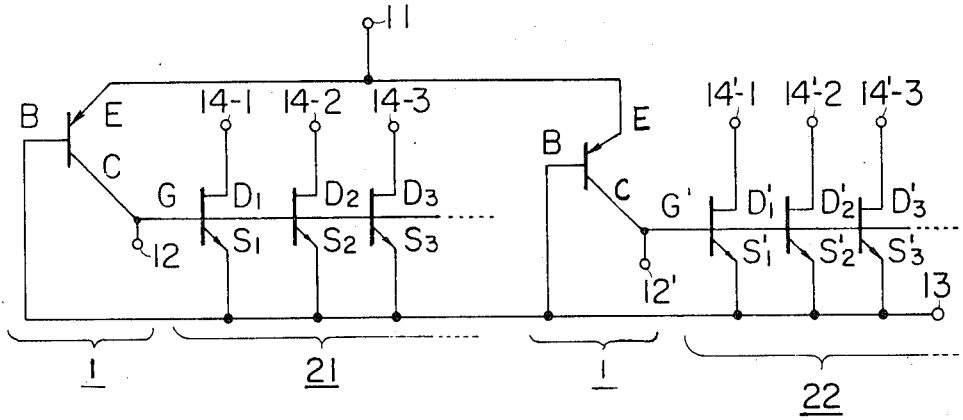

FIGS. 2A to 2C show a basic structure of the MTL-type SITL according to an embodiment of the present invention. In this embodiment, the load transistor is formed with one multi-collector pnp-type bipolar transistor 1 and a plurlity of the inverter transistor units are each formed with a multi-drain SIT. Two 21 and 22 of such SIT's are shown in FIGS. 2A and 2B. The bipolar load transistor 1 comprises a p type heavily doped emitter region 111, an n type base region 113 and a plurality of p type heavily doped collector regions 112, 112', etc. An n+ type base region 113' is provided adjacent to the region 113 for forming an ohmic base electrode 213 therewith. An emitter electrode 211 and collector electrodes 212, 212', . . . are formed on the emitter region 111 and the collector regions 112, 112', . . . , respectively. The emitter, base and collector lead-out terminals 11, 13, and 12, 12', . . . are connected to the respective electrodes 211, 213 and 212, 212', . . . . The collector region 112 of the load transistor 1 also serves as the gate region of an SIT 21 located on the lefthand side of the load transistor 1 and the base region 113 and 113' serves also as the source region of that SIT 21. Heavily doped n+ type regions 114-1 and 114-2 form the drain regions of the SIT 21. Another collector region 112' of the load transistor serves also as the gate region of another SIT 22 located on the righthand side of the load transistor 1. The source region of this SIT 22 is formed with the region 113 and 113', similar to the other SIT 21. The drain regions of this SIT are formed with heavily doped n+ type regions 114'-1 and 114'-2.

More particularly, there exist such n⁻ type regions 113-1 and 113-1', each being surrounded by or sandwiched between the p type regions 111 and 112 or 112'. These regions 113-1 and 113-1' serve as the base region of the multi-collector bipolar load transistor 1. These region 113-1 and 113-1' are electronically continuous to the n⁻ type region 113 and to the n+ type region 113' and hence electrically connected to the electrode 213. Similarly, there exist n⁻ type regions 113-2 which are surrounded by the p type gate region 112. These n⁻ type region 113-2 constitute the channels of the SIT 21. Similarly, n+ type regions 114'-1 and 114'-2 and n⁻ type regions 113-2' constitute the drains and the channels of the SIT 22. Drain electrodes 214-1, 214-2, and 214'-1, 214'-2 are formed on top of these drain regions 114-1, 114-2, and 114'-1, 114'-2. Numerals 14-1, 14-2, 14'-1 and 14'-2 represent drain lead-out terminals, and 121 represents a passivating insulator layer.

In short, the p type region 111, the n⁻ type regions 113-1 and 113-1', and the p type regions 112 and 112' constitute the emitter, the bases and the collectors of the load transistor 1. The n+ and n⁻ type regions 113' and 113, the n⁻ type regions 113-2, the p type region 112 and the n+ type region 114-1 and 114-2 constitute the source, the channel, the gate and the drain regions of one inverter SIT 21, and similarly, the n+ and n⁻ type regions 113' and 113, the n⁻ type regions 113-2', the p type region 112' and the n+ type regions 114'-1 and 114'-2 constitute the source, the channel, the gate and the drain regions of another inverter SIT 22, respectively.

In this instant embodiment, the drain currents of the SIT's flow approximately vertically (normal to the surface). The insulator layer 121 (shown in FIG. 2A but not in FIG. 2B) may be formed with a single layer or multi-layers of silicon oxide ($SiO_2$), silicon nitride ($Si_3N_4$), aluminium oxide ($Al_2O_3$) and/or their mixtures or combinations. The number of multi-drain SIT may be selected to be one or more. Also, the number of the drain of the SIT's can be selected arbitrarily. Such SIT's may be disposed either on both sides or on one side of the load transistor. The connection of the lead-out terminals may be arranged arbitrarily depending on the circuit design. FIG. 2C shows an equivalent circuit of the SITL structure of FIGS. 2A and 2B. In FIG. 2C, two load transistors 1 are shown. As can be seen from this figure, the desired logic operation can be achieved by an appropriate connection of the respective lead-out terminals.

Figure 3A:
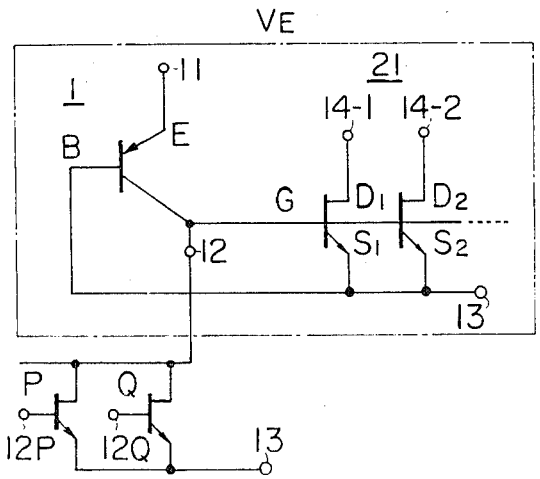
FIGS. 3A and 3B are an equivalent circuit diagram and a characteristic curve diagram for explaining the operation of the logic circuit according to an embodiment of the present invention.

For example, FIG. 3A shows NOR logic circuit connection as viewed with inputs 12P, 12Q and an output 12. This circuit is an OR logic circuit when viewed with the inputs 12P, 12Q and outputs 14-1 and 14-2. The portion which is enclosed in a dotted chain line corresponding to the unit SITL. In the unit SITL, a bias voltage $V_E$ is applied to the emitter 11 of the load bipolar transistor. The base 13 is grounded, and the collector 12 is connected to a wired OR line from the preceding stage, e.g. connected to the drains of SIT's P, Q, ... as shown in the figure. In other words, the load transistor is connected in the base-grounded (i.e. common base) configuration, and it works as a constant current source for the preceding stage. When at least one of the SIT's P, Q, ... in the preceding stage are turned on, the current injected by the load transistor 1 is allowed to flow therethrough and the potential at the collector 12 of the load transistor 1, and hence the potential at the gate of the multi-drain SIT 21, is brought to a low level. Therefore, the gate-source voltage of the multi-drain SIT 21 (i.e. the voltage between the terminals 12 and 13) because low and no current is allowed to flow through the channels of the multi-drain SIT 21. The multi-drain transistor 21 is thus turned off, exhibiting "1" state. On the other hand, when all of the transistors P, Q, ... in the preceding stage are turned off, the current injected from the load transistor 1 is directed to the gate of the SIT 21 and raises the gate potential. Thu, the multi-drain SIT 21 is turned on to allow the currents injected by the load transistors of the following stages to flow therethrough thus exhibiting "0" state.

The operation of this circuit can be most easily understood, and the circuit design is the easiest to make in the instance when the gate-to-source voltage $V_G$ of the multi-drain SIT 21 is positive. Thus, the following description will be made on such instances.

Figure 3B:
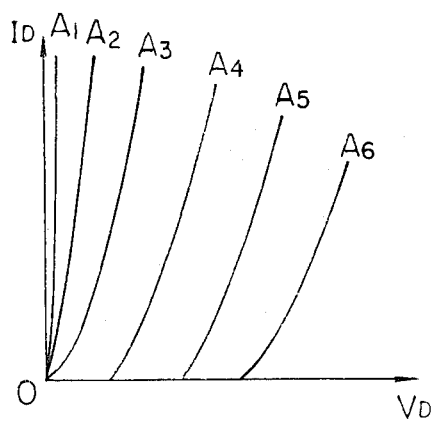

The static drain characteristic of an SIT is shown in FIG. 3B. The drain current-to-drain voltage characteristic is of the triode vacuum tube type. In the case of an n channel SIT, usually a negative voltage $V_G$ is applied to the gate with respect to the source to control the drain current $I_D$ flowing through the channel. Assuming that curve $A_3$ represents the characteristic for $V_G=0$ volt, the drain characteristic curve is varied as $A_3$ to $A_4 \ldots A_5 \ldots A_6$, as the absolute value $|V_G|$ of the negative gate potential $V_G$ is increased. If a positive gate bias voltage is applied, the characteristic curve changes as $A_3$ to $A_2 \ldots A_1$ as the value of $V_G$ is increased. However, if the structure is modified to have the characteristic curve $A_6$ for the zero gate bias by property selecting the shapes, the dimentions and the impurity concentrations, the characteristic curve changes as $A_6$ to $A_5 \ldots$ to $A_1$ as the positive gate bias is increased. As an extreme case, it can be arranged that when the positive gate bias is below the built-in potential or the diffusion potential of the pn junction (about 0.6 volt), almost no current is allowed to flow. Particularly in an SIT, the impurity concentration in the gate region can be selected to be very high, and hence the junction can resemble a one-sided junction and the built-in potential can be made high. The SITL can also be used with the gate potential above the built-in potential. This can be accomplished by the so-called enhancement mode MOS gate type SIT in which the gate is insulated from the channel and no current is allowed to flow through the gate. Further, since the $I_D$-$V_D$ curve for zero gate bias $V_G=0$ can be arbitrarily selected (as one of A's) by design parameters, the selection of the gate voltage $V_G$ can be almost arbitrarily made. The characteristic of the SIT itself, e.g. transconductance $g_m$, voltage amplification factor $\mu$, etc., can be widely varied by such design parameters as the impurity concentration in the channel and the width and the length of the channel. Thus, the current $I_D$-to-voltage $V_D$ characteristic for $V_G=0$ volt can be widely varied.

Thus, the selection of the operation point can be almost arbitrarily made. For example, when the channel is just pinched off at a gate voltage $V_G=0$ volt, the $I_D$-$V_D$ curve becomes as shown by $A_2$. If the impurity concentration in the channel or the channel width is reduced to enhance the pinch-off, the characteristic curve for $V_G=0$ shifts on to $A_3$, $A_4$, .... The logic operation of the SIT according to one embodiment of the present invention is based on the conversion of changes in the gate voltage in the forward direction into changes in the drain current or voltage. In any case, since the SIT has the advantage that the transconductance $g_m$ or the voltage amplification factor $\mu$ can be selected to a large value, a large change in the current $I_D$ or the voltage $V_D$ can be obtained from a small change in the gate potential $V_G$ due to the control of injected majority carriers in the SITL circuit. This leads to the further advantages that the S/N ratio is large and that the fan-out can be made large. Furthermore, since the impurity concentration in the channel region of the SIT can be greatly reduced as compared to that in the depletion layer between the base and collector regions of the bipolar transistor, the capacitances associated with the pn junction in the SIT can be reduced to enable a high speed switching operation. For example, if there exist two order difference in said impurity concentration, the associated capacitance, and hence the operation speed, can be reduced to about one tenth. Furthermore, it is often the case that both the bipolar MTL and the SITL choose the logic amplitude of the order of the built-in potential of the pn-junction which is formed therein. Then, the time delay-power product, i.e. integrated power dissipation, $\tau \times P \approx V^2 C$ can be smaller for the SITL. In the above example, the power dissipation in the SITL becomes about one tenth of that of the bipolar MTL. In the above embodiment, it should be noted that, although the load transistors were bipolar transistors, they may apparently be formed with SIT's. The above-mentioned advantages naturally hold true also for such logic circuits.

An example of the SITL according to the embodiment shown in FIGS. 2A to 2C will be described below. The thickness of the $n^-$ type layer 113 having a low impurity concentration, i.e. the distance from the interface with the layer 113' of a high impurity concentration to the insulating film 12, was selected at about 3 to 4 $\mu$m and the impurity concentration thereof was selected to be $1 \times 10^{14}$ cm$^{-3}$. As is well known in the art (see Grove, *Physics and Technology of Semiconductor Devices*, John Wiley and Sons, Inc., New York, N.Y., 1967, Section 6.14), a semiconductor region having an impurity concentration of $1 \times 10^{14}$ cm$^{-3}$ has a zero bias depletion width of appoximately 3.0 $\mu$m according to the well known one-sided one-dimensional abrupt junction approximation. Accordingly, the total depletion width in a channel region surrounded by gate regions as in FIGS. 2a and 2b is about 6.0 $\mu$m. The width W of the channel region 113-2 was selected at about 2 to 4 $\mu$m (About ⅓ to ⅔ of the total depletion width) so that the channel would be occupied by the depletion layer at the gate potential $V_G=0$ volt. Evidently, the channel width W becomes large if the impurity concentration in the channel is reduced for the same operational conditions. The length l of the channel 113-2 is, preferably, the shorter the better for those purposes: reducing the channel resistance (the small channel resistance being the most pronounced feature of the SIT), and reducing the carrier transfer time, and drifting carriers at a smaller drain voltage $V_{DS}$, and obtained larger velocity at the same drain voltage $V_{DS}$. In this case, the length l of the channel was selected to be about 2 to 2.5 μm. Furthermore, the distance d between the gate region 112 and the low resistivity source region 113' is preferably long for reducing the source-gate capacitance, but is preferably short for obtaining a large gain. Thus, an appropriate value including zero can be chosen according to the circuit purposes. In this case, this distance d was selected to b around 1.5 to 2 μm. The impurity concentration in the low resistivity region 113' which is located adjacent to the common source/base electrode 13 is preferably high for forming ohmic contact and for injecting many carriers and was selected at about $5 \times 10^{19}$ cm$^{-3}$. The impurity concentration in the drain regions 114-1, 114-2, ... and 114'-1, 114'-2, ... is preferably high for forming ohmic contact with the metal electrode, but is preferably low for reducing the drain-gate capacitance. In this case, it was selected to be around $5 \times 10^{18}$ cm$^{-3}$. Next, the impurity concentration in the gate regions 112 and 112' (which are to be formed simultaneously with the emitter region 111) is preferably high for extending the depletion layer substantially in the channel 113-2 and for decreasing the series resistance in the gate region. In this example, the surface impurity concentration of the gate region 112 was no made very high but was selected at about $1 \times 10^{18}$ cm$^{-3}$. Here, the impurity concentration in the channel region 113-2 and 113-2' and in the base region 113-1 is preferably low for increasing the injection efficiency in the load bipolar transistor and for decreasing the channel capacitance. The above-mentioned values are to be determined in accordance with the required performance and rating of the SITL. Here, it is to be noted that such parameters should be selected to allow the inverter transistor to function as a static induction transistor (SIT). In this example, when the gate dimension was 30 μm × 30 μm, the delay-powder product $\tau \times P$ was about 0.037 pJ (with two fan-outs) and about 0.045 pJ (with four fanouts) which values are about one order smaller than the conventional values.

Figure 4A:
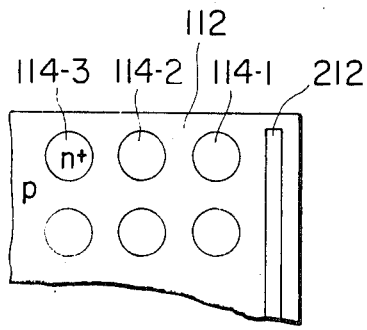
FIGS. 4A to 4F are partial plan and cross-sectional views of other embodiments of the present invention.
Figure 4B:
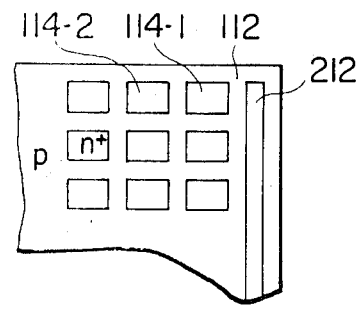
Figure 4C:
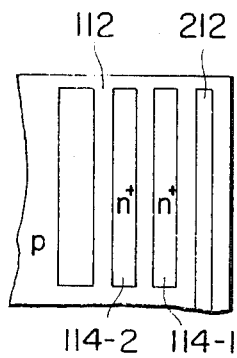
Figure 4D:
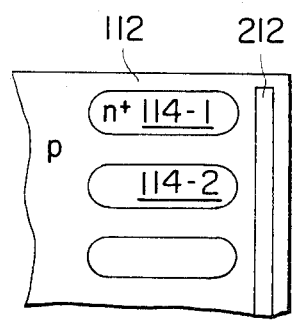
Figure 4E:
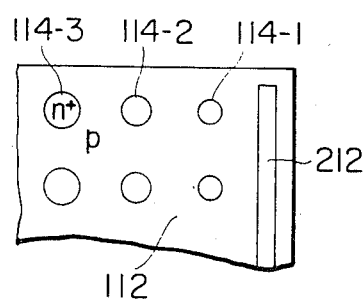
Figure 4F:
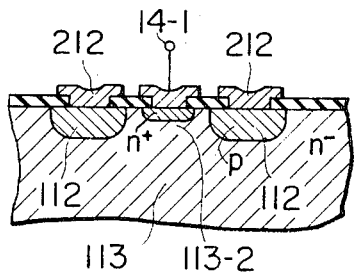

Although cylindrical channels (circular cross-section as shown in FIG. 4a) was employed in the embodiment of FIGS. 2A to 2C, any shapes can be adopted for the channel provided that the current flowing through the channel can be effectively controlled by the gate voltage. For example, channels having square, rectangular or elliptic cross-sections as shown in FIGS. 4B to 4C can be adopted. Furthermore, the output SIT's can be either positioned on one side of or on both sides of or the load transistor. Still further, when the gate regions are elongated in one direction, the elongated axis may be disposed either parallel with or perpendicular to or in any direction relative to the load transistor. This becomes possible by the fact that the impurity concentration in the gate region (i.e. the collector region of the load transistor) can be made high and that the resistance in this region can be low enough. Namely, the voltage drop in the gate region is negligible. When the gate resistance is not negligibly small, the size of the channels may be varied depending on the distance from the metal gate electrode 212 or from the load transistor as shown in FIGS. 4C and 4E. On the other hand, for further decreasing the gate resistance, the metal electrode 212 may be deposited on all the gate regions 112 surrounding the respective channels as shown in the cross-section of FIG. 4F. Yet for reducing the drain-gate capacitance, the heavily doped drain regions 114-1, 114-2, ... may be separated away from the heavily doped gate regions 112, for example by off-setting the drain regions 114-1, 114-2, ... with respect to the gate regions 112 as in the case of the mesa structure drain.

An example of the steps for forming the SITL structure as shown in FIGS. 2A and 2B will be described next.

First, an n$^-$ type silicon layer 113 is epitaxially grown on an n$^+$ type silicon substrate 113' by a hydrogen reduction of SiHCl$_3$ or by a thermal decomposition of SiH$_4$ (FIG. 5A). A doped oxide layer consisting of SiO$_2$ containing boron B as a p type impurity is deposited on the n$^-$ type epitaxial layer 113 in the atmosphere of SiH$_4$+O$_2$+B$_2$H$_6$ at 500° C. This doped oxide layer is selectively removed by the usual photolithography to leave those portions 122 on the p type emitter region 111 of the load transistor and the p type gate regions 112 and 112' of the multi-drain SIT's to be formed. Then, the wafer is heat-treated in an oxygen atmosphere to diffuse the p type impurity, thereby forming the emitter region 111 and the gate regions 122 and 122' (FIG. 5B), respectively. In this heat treatment, it should be noted that, since an oxide film 121 is formed on the entire surface of the wafer, the p type impurity (boron B) does not diffuse into those portions which are not covered by the doped oxide layer 122 even if the p type impurity may or redeposit on such regions. Indeed, the exposed silicon surface may be slightly etched away by relying on the plasma etching or chemical etching technique prior to the heat treatment conducted in the oxgen atmosphere, according to necessity. Then, the oxide layer is selectively removed away by the photolithiography to open windows on the drain regions 114-1, 114-2, and 114'-1, 114'-2, ... of the multi-drain SIT's. Then, an n type impurity (e.g,. arsenic As) is diffused thereinto to form the drain regions (FIG. 5C). Thereafter, by exposing the silicon surface on such regions as the emitter region 111, the gate regions 112 and 112', and the drain regions 114-1, 114-2, ... and 114'-1, 114'-2, ... by relying on photolithography, a metal (e.g. aluminium Al) film is vapor-deposited. Unnecessary portions of the metal film are removed by photolithography to leave the respective metal electrodes 211, 212, 212', 214-1, 214-2, ... and 214'-1, 214'-2, .... Another metal film is formed in the rear surface to form the base/source electrode 213.

As can be seen from the above statement, the SITL according to the present invention can be manufactured in an easy and simple manner. In the above-mentioned example, the number of photo-lithographic steps is only four. Thus, the manufacturing cost is greatly reduced.

An alternative example of the manufacturing steps will be described below. On the doped oxide film 122, a silicon nitride film is formed by relying on the known chemical vapor deposition (CVD). Then, the nitride film is selectively etched away by relying on the plasma etching or the phosphoric acid etching technique using photolithography. Utilizing the left-behind nitride film as a mask, the doped oxide film is selectively etched. After carrying out the diffusion of the p type impurity from the doped oxide film, an oxide film formed on the surface is selectively or totally etched away, and then n type impurity is diffused. When the oxide layer is totally etched away, a part of the base regions of the load transistor is also diffused with the n type impurity to form n type regions. This serves to decrease the undesirable surface recombination, and hence contributes to an increasing of the common emitter current gain β of the bipolar transistor, and the number of photolithographic steps can be reduced. This is one type of the so-called self-alignment technique and is particularly effective for increasing the integration density. Furthermore, the formation of the n+ type diffused layer can also be carried out by first depositing a polycrystalline n type silicon layer on the surface by the CVD method and then diffusing the impurity. In such a case, it is also possible to form metal electrodes on the polycrystalline layer on the respective n+ type diffused layers. Furthermore, diffusion of more than one kind of impurities having different atomic radii from that of silicon into the diffused layers for compensating for the lattice strain is effective for the viewpoint of preventing the generation of defects such as dislocations.

Next, another embodiment of the SITL structure is shown in FIG. 6. This structure is basically similar to that of FIG. 2. In this embodiment, however, the p type emitter region 111 of the load transistor and the p type gate regions 112 of the multi-drain SIT have lateral extensions in the crystal to reduce the channel width of the SIT. According to this structure, there are provided such advantages that the drain-gate capacitance can be reduced, that the gain of the SIT is increased and that the fan-out of the SIT can be made larger. The existence of an n+ type region 114-A in the n type base region 113-1 of the load transistor is not always necessary, but it helps to increase the common emitter current gain $\beta$ as described above.

Such characteristic extensions of the emitter region 111 and the gate regions 112 can be formed by relying on the following methods. One such method comprises the steps of forming regions of a high impurity concentration in the crystal by ion-implanation of a p type impurity such as boron B or aluminium Al, and then carrying out a diffusion from the surface in the manner a shown in FIG. 5B. Another method comprises the steps of first growing an n type epitaxial layer 113, then diffusing a type impurity in predetermined regions (or growing doped regions), followed by further growing another epitaxial layer, and then carrying out the usual diffusion as shown in FIG. 5B.

FIG. 7 shows another embodiment of the structure of the SITL. In this structure, the load is formed with a vertical bipolar transistor. A p+ type emitter region 111 is disposed below an n− *type layer* 113 *of a low impurity concentration which serves as the base region, and a p+* type collector region 112 is exposed on the upper surface, and this collector region also serves as the gate region of the multi-drain SIT. The n+ type region 113' serves as the source of the SIT, and it is formed adjacent to and between the p+ type emitter region 111 and the n− low impurity concentration layer 113 (i.e. at the interface therebetween). The n− type layer 113 is in contact with the p+ type emitter region 111 only at the sites below the collector electrode 212 and the collector region 112 of the load transistor. The electrically connected p type regions 112 shown on the righthand side of the collector region 112 constitute the gate regions of the SIT. The n+ type drain regions 114-1, 114-2, . . . are exposed on the upper surface. Thus, only the collector/gate and the drain electrodes 212 and 214-1, 214-2, . . . are formed on one surface, enabling a further increase in the integration density.

FIG. 7 shows two units of SITL's. According to this structure, a high integration density is provided, and the injection effiency in the load transistor can be enhanced to a high extent. Together with the large gain of the SIT, the number of fan-outs can be taken large. Further, the n+ type source region 113' has a higher Fermi level that that of the n− type region. Thus, due to the difference in the built-in voltages between the regions 111 and 113 and between the regions 111 and 113', the injection of holes into the n− type layer 113 can be controlled so as to occur only through the windows in the n+ type source region 113' where the p type region 111 is exposed to the n− type layer 113. Furthermore, by virtue of the vertical structure, the base width can be made small, which in turn constitutes another factor of increasing the injection efficiency. The shape of such window is selected, depending on the shape of the collector region, and it may be of a comb shape, rectangular, elliptic, and other shapes.

The manufacture of this SITL structure can be accomplished in the manner stated as follows. First, an n+ type regions 113' are selectively diffused into a p+ type silicon substrate 111, and an n− type epitaxial layer 113 is grown thereon. Then, similar steps as shown in FIGS. 5B to 5D are carried out. Thus, the number of photolithographic steps increases only by one according to this embodiment, but it is still significantly smaller than that required by the usual IIL structure, which is seven. It can be seen that the gate structure shown in FIG. 6 can be combined in this structure.

FIG. 8 shows a further embodiment of the SITL structure. In this structure, p+ type regions 115 and 116 are formed between the n+ type region 113' and the n− type region 113, so as to be disposed below but separated from the emitter region 111 of the load transistor and also from the gate regions (collector regions) 112 of the SIT (inverter transistor). This structure is particularly effective in raising the gain of the SIT.

As has been described above, according to the present invention, there can be provided a logic integrated circuit of a high integration density, low power dissipation and high speed operation, which can be manufactured in an easy and simplified manner at a low manufacturing cost. Although the SIT's have been described with respect to an instance of having n channels, SIT's having p channels with the reversed conductivity type of the respective regions may also be used with the same efficiencies. Also, the semiconductor material is not limited to silicon, but such materials as germanium Ge, III-V compounds such as GaAs and so forth may be used also. Moreover, the SIT's are not limited to those of the junction type, but those of Schottky barrier type or MOS type may be formed as well.

What is claimed is:

1. A semiconductor integrated circuit comprising a merged transistor logic device including at least one driver transistor, and at least one load transistor, said device comprising:

a semiconductor wafer having a first and a second principal surface;

a first semiconductor region of a first conductivity type and a low impurity concentration and formed in the first principal surface of said semiconductor wafer, said first semiconductor region carrying a channel region of said inverter transistor and forming a base region of said load transistor;

at least one heavily doped second semiconductor region of a second conductivity type opposite to said first conductivity type and formed in said first semiconductor region and at least partially exposed to said first principal surface, the second heavily doped region forming a collector region of said load transistor and a gate region for said driver transistor;

at least one heavily doped third semiconductor region of the second conductivity type forming an emitter region for said load transistor;

at least one channel region of said first conductivity type associated with said at least one driver transistor and having a low impurity concentration, said channel region being formed through said heavily doped second semiconductor region into said first semiconductor region thereby to serve as a channel of said driver transistor, said channel region being formed so as to have a width of about one-third to two-thirds of the width of a depletion layer spread established by the built-in potential due to the second semiconductor region;

at least one heavily doped drain region of said first conductivity type associated with said at least one driver transistor, and being formed in said first principal surface of the semiconductor wafer and located adjacent to said channel region; and a heavily doped source region of said first conductivity type associated with said at least one driver transistor being formed in said semiconductor wafer adjacent to said channel region below said drain region, the source region being larger than said drain region.

2. A semiconductor integrated circuit according to claim 1, wherein said drive further comprises:

said third semiconductor region being formed in the first semiconductor region and being partially exposed at the first principal surface, said third semiconductor region being separated from said second semiconductor region by said first semiconductor region.

3. A semiconductor integrated circuit according to claim 1 or 2, wherein said device further comprises:

an embedded heavily doped fourth region of said second conductivity type formed in said first semiconductor region and adjacent to said source region of said at least on driver transistor but separated from said second semiconductor region of said second conductivity type, thereby forming barrier regions for defining the effective current path of said at least one driver transistor; and said heavily doped source region of said first conductivity type being partially exposed to said first semiconductor region, partially exposed to said embedded heavily doped fourth region, and at least partially exposed to said second principal surface.

4. A semiconductor integrated circuit according to claim 1 or 2, wherein said device comprises:

said at least one heavily doped second semiconductor region has extensions into said channel region of said at least one driver transistor so that said channel region has a smaller cross-sectional area near said first semiconductor region.

5. A semiconductor integrated circuit according to claim 1, wherein said device further comprises:

said third semiconductor region of said second conductivity type formed adjacent to said first semiconductor region below said at least one heavily doped second semiconductor region.

6. A semiconductor integrated circuit according to claim 5, wherein said heavily doped source region of said at least one driver transistor intervenes between said first semiconductor region and said third semiconductor region, said source region having windows at least below said second conductivity region.

* * * * *